United States Patent [19]
Maszara et al.

[11] Patent Number: 5,965,917
[45] Date of Patent: Oct. 12, 1999

[54] STRUCTURE AND METHOD OF FORMATION OF BODY CONTACTS IN SOI MOSFETS TO ELIMATE FLOATING BODY EFFECTS

[75] Inventors: Witold Maszara, Sunnyvale; Srinath Krisnan, Campbell, both of Calif.

[73] Assignee: Advanced Micro Devices, Inc., Sunnyvale, Calif.

[21] Appl. No.: 09/225,248

[22] Filed: Jan. 4, 1999

[51] Int. Cl.⁶ .......................... H01L 27/01; H01L 27/12; H01L 31/0392
[52] U.S. Cl. .......................... 257/347; 257/382; 257/384; 438/151
[58] Field of Search .................................. 257/347, 352, 257/353, 354, 382, 384; 438/151

[56] References Cited

U.S. PATENT DOCUMENTS

| | | | |
|---|---|---|---|
| 5,489,792 | 2/1996 | Hu et al. | 257/347 |
| 5,543,636 | 8/1996 | Yamazaki | 257/66 |
| 5,596,215 | 1/1997 | Huang | 257/344 |
| 5,674,760 | 10/1997 | Hong | 437/24 |
| 5,696,386 | 12/1997 | Yamazaki | 257/57 |
| 5,742,088 | 4/1998 | Pan et al. | 257/382 |
| 5,796,126 | 8/1998 | Han et al. | 257/141 |

*Primary Examiner*—Ngân V. Ngô
*Attorney, Agent, or Firm*—Skjerven, Morrill, MacPherson, Franklin, & Friel, LLP; Edward C. Kwok; Glen B. Choi

[57] ABSTRACT

A silicon-on-insulator MOSFET includes a silicon layer and an insulator layer positioned over a silicon substrate. An isolation region defines a silicon region positioned over the insulator layer. The silicon region further includes a source region, a drain region, and a doped body region. The drain region and source region do not extend to the bottom of the silicon region. A first metal conductor is electrically coupled to the side and top of the source region and the side of the body region. The first metal conductor establishes a potential at the body region to control floating body effects. A second metal conductor is electrically coupled to the top of the drain region.

9 Claims, 5 Drawing Sheets

STRUCTURE AND METHOD OF FORMATION OF BODY CONTACTS IN SOI MOSFETS TO ELIMATE FLOATING BODY EFFECTS

FIELD OF THE INVENTION

The present invention relates to silicon-on-insulator devices, and more particularly to silicon-on-insulator devices fabricated to eliminate floating body effects.

BACKGROUND OF THE INVENTION

Silicon-on-insulator (SOI) metal oxide semiconductor field effect transistors (MOSFETs) are well known in the field of semiconductors. SOI MOSFETs have been demonstrated to be superior to bulk silicon MOSFETs in low-power, high-speed very large scale integration (VLSI) applications. The advantages include 1) less junction capacitance so that higher circuit speed can be achieved; 2) better device isolation; and 3) sufficient radiation hardness.

FIG. 1 depicts a SOI MOSFET semiconductor structure 100 of the prior art. Structure 100 includes insulator 114 positioned over bottom substrate layer 116. Insulator 114 surrounds body region 112. Source region 108 and drain region 110 are positioned within body region 112, and gate electrode 106 is positioned above body region 112. Side wall spacers 122 and 124 surround gate electrode 106. A barrier layer 118 and oxide layer 120 are formed over insulator 114, source region 108, drain region 110, and gate electrode 106. Electrical contacts 102 and 104, source region 108, and drain region 110 are formed through barrier layer 118 and oxide layer 120.

As shown, electrical contacts 102 and 104 only contact respective source region 108 and drain region 110. Body region 112 is electrically isolated and therefore its voltage varies with the voltages applied to either source region 108, drain region 110, or gate electrode 106. When a voltage applied to a source or drain region changes, the voltage of body region 112 also changes to accommodate the change in applied voltage, but in a different amount of time than it takes the source or drain terminals to achieve the applied voltage. The voltage of body region 112 varies undesirably because the body region is electrically isolated (so called "floating body effect"). The floating body effect introduces undesirable effects.

Floating body effects cause, for example, sharp increases in the relationship between drain current and drain voltage (so called "kink effect"), anomalous subthreshold current, transient current overshoot, and early device voltage $V_{DS}$ breakdown. The kink effect may lead to lower device gain, which is undesirable in analog applications. Floating body effects remains a major obstacle to acceptable operation of SOI MOSFET transistors.

What is needed is an SOI MOSFET semiconductor structure and method of fabricating the SOI MOSFET semiconductor structure which controls the floating body effects.

SUMMARY

An embodiment of the present invention includes a silicon-on-insulator structure including 1) a silicon substrate layer; 2) an insulator layer over the silicon substrate layer; 3) a silicon region over the insulator layer; 4) a body region formed within the silicon region, the body region further includes a first doped region and a second doped region; 5) an isolation region formed in the silicon region that surrounds the body region; and 6) a metal connector that directly contacts a top and side of the first doped region and a side of the body region.

Another embodiment of the present invention includes a method of forming a semiconductor-on-insulator structure in a structure including a bottom substrate layer, middle insulator layer, and top silicon layer, including: 1) forming at least two isolation regions in the silicon layer to the depth of the insulator layer to define a silicon region; 2) doping the silicon region; 3) forming a first and second doped regions in the doped silicon region, the first doped region and the second doped region are not as deep as the silicon region; and 4) forming an electrical contact to directly contact a side of the silicon region and a top and side of the first doped region.

The present invention will be more fully understood in light of the following detailed description taken together with the accompanying drawings.

BRIEF DESCRIPTION OF THE DRAWINGS

Note that use of the same reference numbers in different figures indicates the same or like elements.

DETAILED DESCRIPTION

Figure 2:
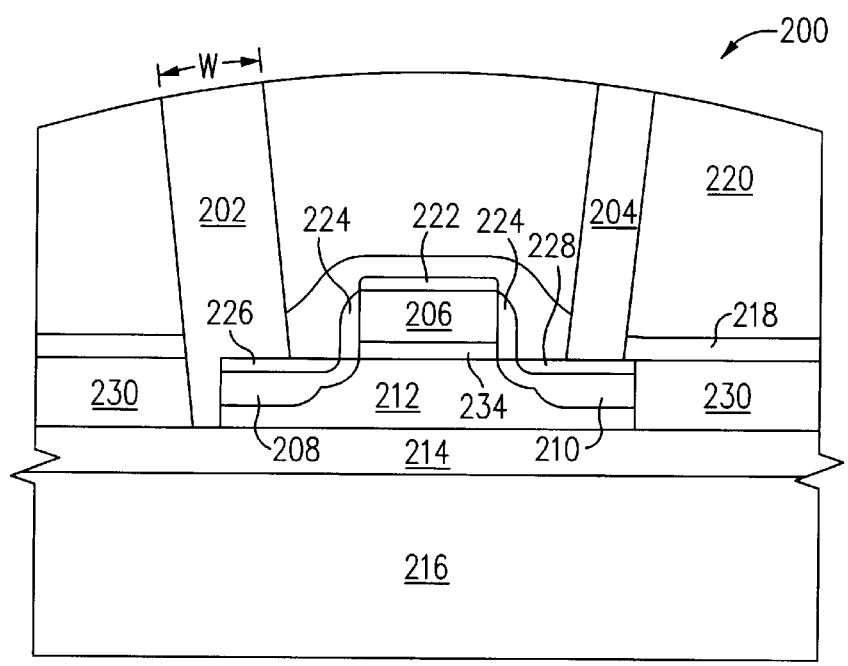
FIG. 2 depicts an SOI N-MOSFET semiconductor structure 200 in accordance with a first embodiment of the present invention.

FIG. 2 depicts an SOI N-MOSFET semiconductor structure 200 in accordance with a first embodiment of the present invention. The structure 200 could easily be modified to be a SOI P-MOSFET semiconductor structure. A method of fabricating structure 200 is described later with respect to a second embodiment of the present invention.

A conventional n-type substrate layer 216 that is approximately 800 microns thick is covered by a conventional silicon dioxide layer 214 that is approximately 2000 angstroms thick. Located above silicon dioxide layer 214 are conventional isolation region 230, a conventional body region 212, and electrical contact 202. Each isolation region 230 is approximately 2000 angstroms thick. In this embodiment, body region 212 is p-type and is approximately 2000 angstroms thick.

A conventional n+ source region 208 and conventional n+ drain region 210 are present within conventional body region 212. Source region 208 and drain region 210 are not as thick as body region 212. Electrical contact 202 contacts the top as well as the side of source region 208 and the side of body region 212. A suitable material for electrical contact 202 is tungsten. Approximately half of the width W of electrical contact 202 extends to contact the side of source region 208 and body region 212.

Conventional oxide layer 234 covers a portion of body region 212 between source region 208 and drain region 210. In this embodiment, oxide layer 234 is silicon dioxide and is approximately 15 to 100 angstroms thick.

A conventional n-type gate electrode 206 is positioned above oxide layer 234 between source region 208 and drain region 210. Gate electrode 206 is approximately 1500 to 2500 angstroms thick. Side wall spacers 224 cover sides of gate electrode 206. Side wall spacers 206 are approximately 200 to 2000 angstroms thick and are made of silicon dioxide ($SiO_2$), or silicon nitride ($Si_3N_4$), or a combination of silicon dioxide and silicon nitride.

A conventional silicide cover 222 covers gate electrode 206. Similarly, conventional silicide covers 226 and 228 cover respective source region 208 and drain region 210. A suitable material for the silicide covers is a metal silicide such as titanium or cobalt silicide. The silicide covers are approximately 200 to 2000 angstroms thick.

Conventional electrical contact 204 contacts silicide cover 228 and extends to the surface of structure 200. A suitable material for electrical contact 204 is tungsten.

Conventional barrier layer 218 covers portions of silicide covers 226 and 228, silicide cover 222, side wall spacers 224, and isolation region 230. Barrier layer 218 is approximately 300 angstroms thick. A suitable material for barrier layer 218 is silicon oxi-nitride.

Conventional oxide layer 220 covers barrier layer 218. Oxide layer 220 is approximately 5000 to 10000 angstroms thick. A suitable material for oxide layer 220 is silicon dioxide.

Figure 1:
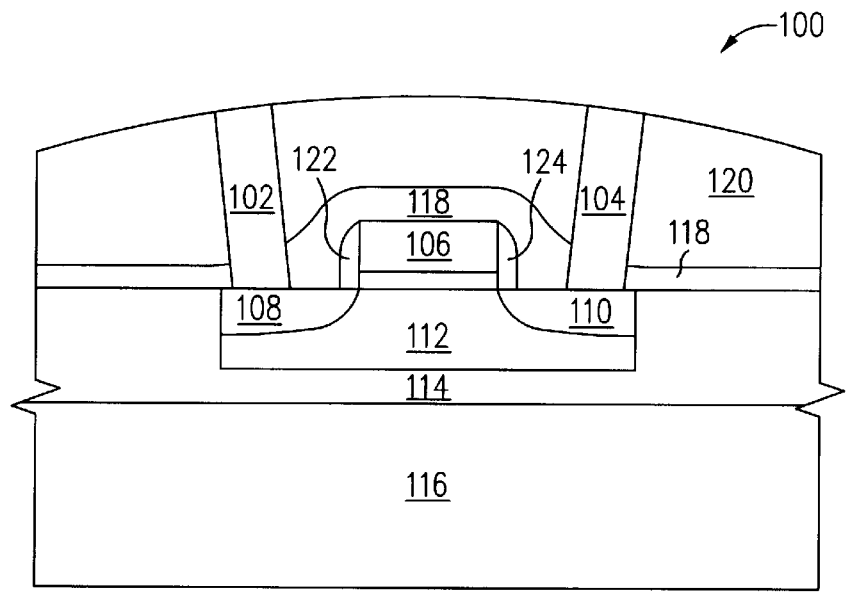
FIG. 1 depicts a SOI MOSFET semiconductor structure 100 of the prior art.

In the prior art, as shown in FIG. 1, electrical contact 102 is in contact with only the top surface of source region 108. In the prior art, the voltage of body region 112 varies uncontrollably because the body region is electrically isolated. In the first embodiment of the present invention, a voltage applied to electrical contact 202 sets the voltage of body region 212 because electrical contact 202 is directly coupled to body region 212.

Figure 3:
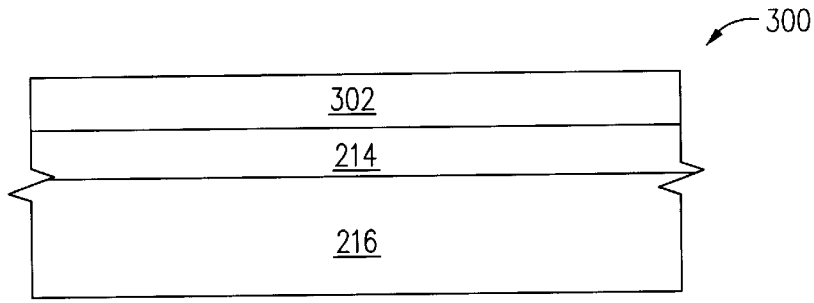
FIG. 3 depicts a conventional SOI wafer 300 as is well known in the prior art.

A second embodiment of the present invention includes a process to fabricate structure 100 of the first embodiment of the present invention. FIG. 3 depicts a conventional SOI wafer 300 as is well known in the prior art. A suitable silicon wafer includes an upper layer of crystalline silicon 302, a middle layer of silicon dioxide ($SiO_2$) 214, and a lower substrate layer 216. Upper layer 302 is approximately 2000 angstroms thick, middle layer 214 is approximately 2000 angstroms thick, and substrate layer 216 is approximately 800 microns thick. A suitable embodiment of SOI wafer 300 is available for example from Ibis Technology.

Figure 4:
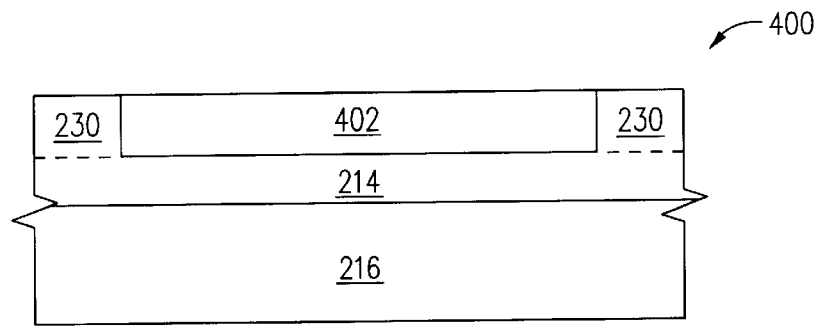
FIG. 4 depicts a structure 400 showing silicon region 402 surrounded by isolation region 230.

Next, two conventional isolation regions are formed in upper layer 302. Isolation regions are formed to the depth of middle layer 214 to isolate a silicon region. FIG. 4 depicts a resulting structure 400 showing silicon region 402 surrounded by isolation region 230. A suitable method to create isolation region 230 is a well known shallow trench isolation technique. For example, a dry etch technique may be used to form isolation region 230 to the depth of middle layer 214. Isolation region 230 is then filled with conventional oxides.

Figure 5:
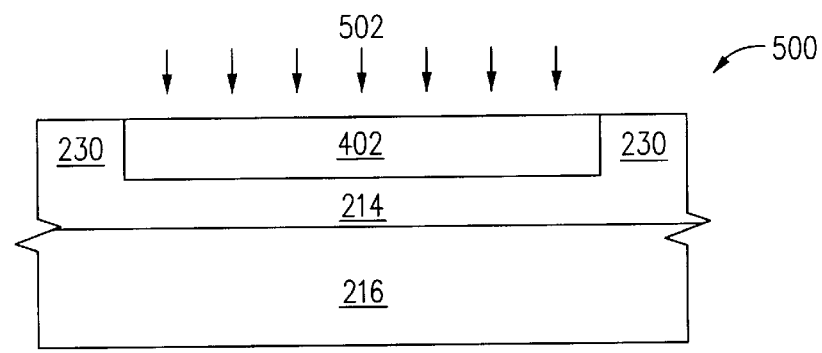
FIG. 5 depicts a doping of silicon region 402 with ions 502.

Next, silicon region 402 is doped conventionally by ions 502 to become a p-type body region 212. FIG. 5 depicts a doping of silicon region 402 with ions 502. A suitable technique is to apply a dose of $1\times10^{13}$ p–/$cm^2$ of boron ions. After doping silicon region 402 becomes body region 212 (not depicted).

Figure 6:
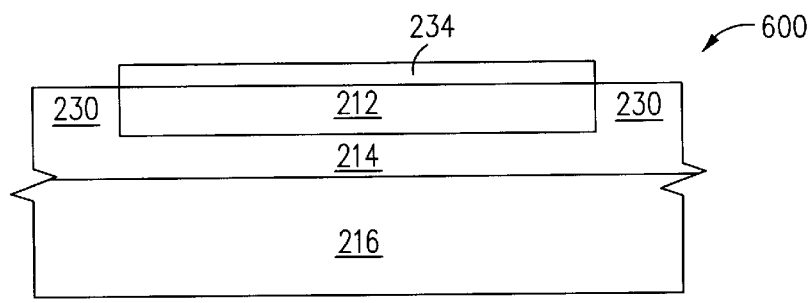
FIG. 6 depicts a structure 600 with oxide layer 234.

Next, an oxide layer is formed conventionally over body region 212 of structure 500 by a conventional thermal oxidation technique. Oxide layer 234 has a thickness of 15 to 60 angstroms. FIG. 6 depicts the resulting structure 600 with oxide layer 234.

Figure 7:
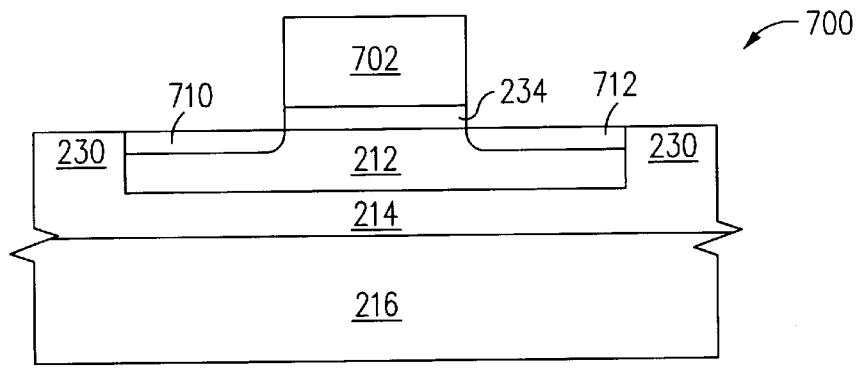
FIG. 7 depicts a resulting structure 700 with gate region 702.

A gate region is next formed conventionally over oxide layer 234 of structure 600. A suitable technique is to deposit a layer of amorphous silicon or polysilicon over structure 600 and then apply a dry etch to form gate region 702. FIG. 7 depicts the resulting structure 700 with gate region 702. A suitable thickness for gate region 702 is 1500 to 2500 angstroms.

Figure 8:
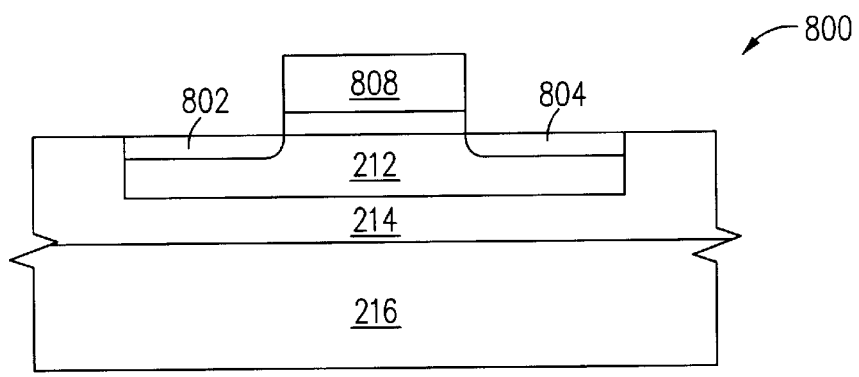
FIG. 8 depicts a structure 800 with source region 802, drain region 804, and doped gate region 808.

Next, conventional shallow source and drain regions are formed in the structure 700 of FIG. 7 and gate region 702 is doped. A suitable technique is to implant the top of regions shown as 710 and 712 and gate electrode 702 of FIG. 7 each with $1\times10^{14}$ n+/$cm^2$ of arsenic ions for example. FIG. 8 depicts the resulting structure 800 with source region 802, drain region 804, and doped gate region 808.

Figure 9:
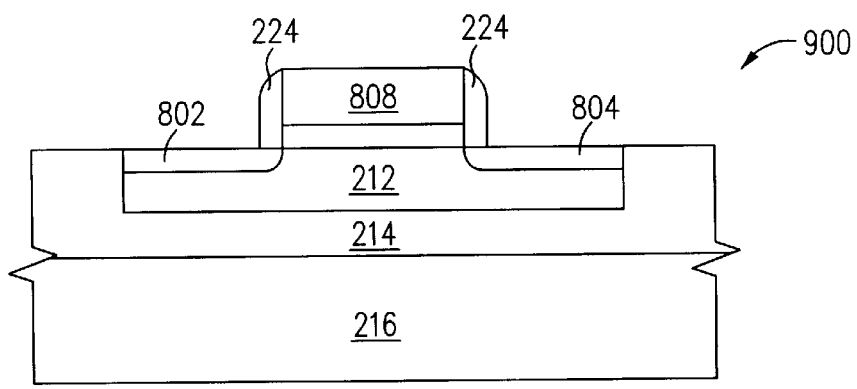
FIG. 9 depicts resulting structure 900 with side wall spacers 224.

Next, side wall spacers are formed conventionally on the side of doped gate region 808 of structure 800 of FIG. 8. A suitable technique to form side wall spacers is to deposit oxide or nitride over the structure 800 of FIG. 8 and then anisotropically etch the resulting structure. A suitable width for side wall spacers is 200 to 2000 angstroms. FIG. 9 depicts resulting structure 900 with side wall spacers 224.

Figure 10:
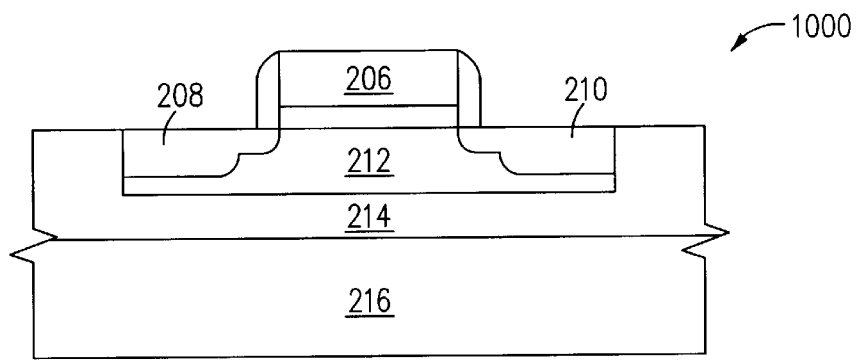
FIG. 10 depicts a structure 1000 with source region 208, drain region 210, and gate electrode 206.

Next a conventional deep source region and conventional deep drain region are formed in the structure 900 of FIG. 9. The deep source and drain regions are formed to a depth above middle layer 214. A suitable technique is to apply a dose of $1\times10^{15}$ n+/$cm^2$ of ions such as arsenic or boron to the surface of regions 802 and 804 and doped gate region 808. An energy level should be chosen so that the resulting source and drain junctions are formed above middle layer 214. The resulting structure is then annealed at a temperature of 1000° C. for less than 1 minute. FIG. 10 depicts the resulting structure 1000 with source region 208, drain region 210, and gate electrode 206.

Figure 11:
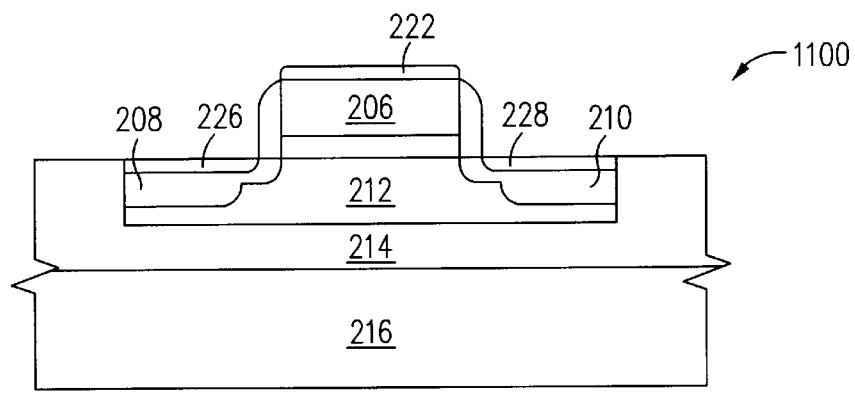
FIG. 11 depicts a structure 1100 with silicide covers 226, 222, and 228.

Next a silicide is conventionally formed over gate electrode 206, and over source region 208 and drain region 210 of structure 1000 of FIG. 10. A suitable technique is to deposit a metal such as titanium or cobalt over structure 1000. Then the resulting structure is heated to a temperature of approximately 400 to 500° C. to form a metal silicide. The portions of metal outside of gate electrode 206, source region 208, or drain region 210 are removed by a conventional etch technique. The resulting structure is then heated again to a temperature of 700 to 800° C. The thickness of each silicide cover is approximately 200 to 300 angstroms or at least a thickness shallower than the depth of the source or drain junctions. FIG. 11 depicts a structure 1100 with silicide covers 226, 222, and 228.

Figure 12:
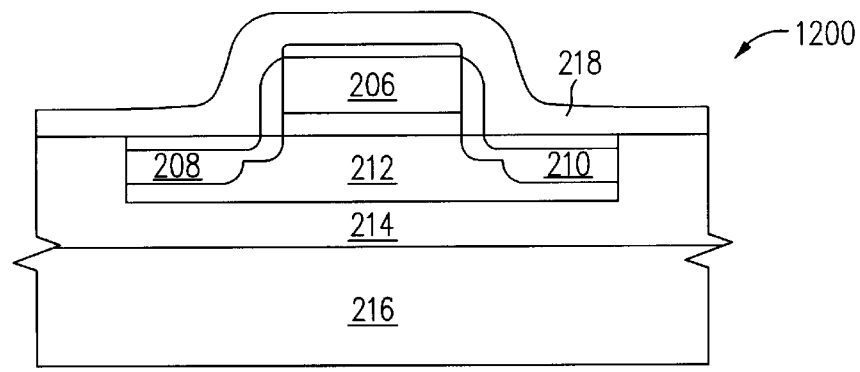
FIG. 12 depicts a structure 1200 with barrier layer 218.

Next a conventional barrier layer is deposited over the structure 1100 of FIG. 11. A suitable technique is to apply a silicon oxi-nitride layer over structure 1100. A suitable thickness of the barrier layer is approximately 300 angstroms. FIG. 12 depicts the resulting structure 1200 with barrier layer 218.

Figure 13:
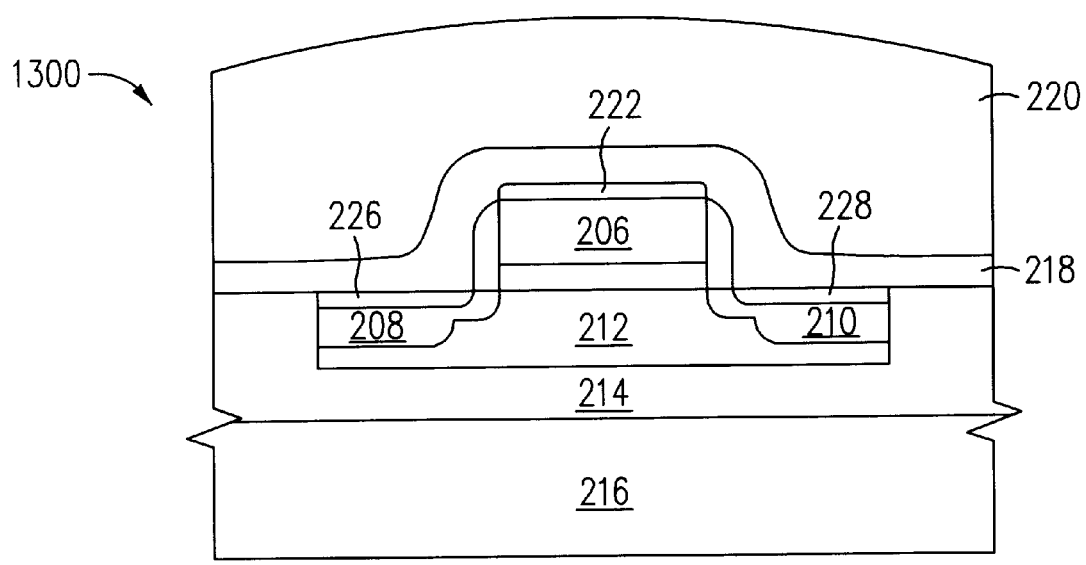
FIG. 13 depicts the resulting structure 1300 with oxide layer 220.
Figure 14:
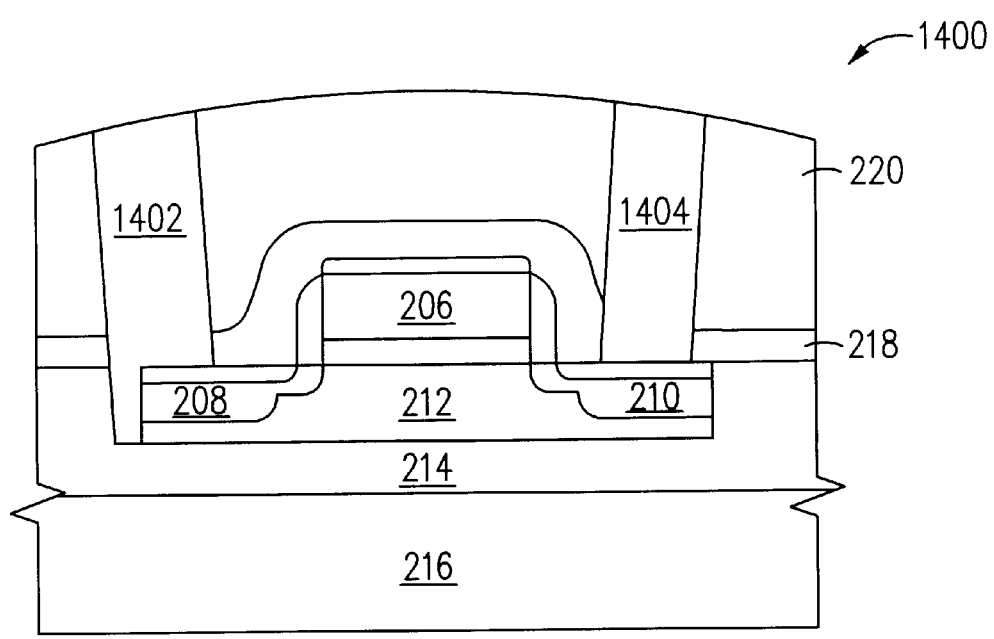
FIG. 14 depicts structure 1400 with openings 1402 and 1404.

Next a conventional oxide layer is applied over the structure 1200 of FIG. 12. FIG. 13 depicts the resulting structure 1300 with oxide layer 220. Oxide layer is approximately 5000 to 10000 angstroms thick. A suitable material for oxide layer 220 is silicon dioxide.

Next openings 1402 and 1404 are formed in structure 1300. Opening 1402 defines an open space adjacent to the side of body region 212 and source region 208 and above source region 208. Opening 1404 defines a space above drain region 210. A suitable technique to form openings 1402 and 1404 is a conventional dry etch.

Openings 1402 and 1404 are next filled with an electrically conductive material to provide electrical contacts. Any excess electrically conductive material on the top of oxide layer 220 is then removed. The resulting structure is shown as structure 200 of FIG. 2 with electrical contacts 202 and 204. A suitable electrically conductive material is a metal such as tungsten.

The above-described embodiments of the present invention are illustrative and not limiting. It will thus be obvious to those skilled in the art that various changes and modifications may be made without departing from this invention in its broader aspects. For example, electrical contact 204 could be coupled to the top and side of drain region 210 and the side of body region 212 and electrical contact 202 is coupled to the top of source region 208. Further the dose quantities and thicknesses provided are merely illustrative and can be varied. Therefore, the appended claims encompass all such changes and modifications as fall within the true spirit and scope of this invention.

What is claimed is:

1. A silicon-on-insulator structure comprising:

a silicon substrate layer;

an insulator layer over said silicon substrate layer;

a silicon region over said insulator layer;

a body region formed within said silicon region, wherein said body region further includes a first doped region and a second doped region;

an isolation region formed in said silicon region that surrounds said body region; and a metal connector that directly contacts a top and side of said first doped region and a side of said body region.

2. The silicon-on-insulator structure of claim 1 wherein said first doped region comprises a source region.

3. The silicon-on-insulator structure of claim 1 wherein said first doped region comprises a drain region.

4. The silicon-on-insulator structure of claim 1 wherein bottom sides of said first and second doped region are not in contact with said insulator layer.

5. A method of forming a semiconductor-on-insulator structure in a structure including a bottom substrate layer, middle insulator layer, and top silicon layer, comprising:

forming at least two isolation regions in said silicon layer to the depth of said insulator layer to define a silicon region;

doping said silicon region;

forming a first and second doped regions in said doped silicon region, wherein said first doped region and said second doped region are not as deep as said silicon region; and forming an electrical contact to directly contact a side of said silicon region and a top and side of said first doped region.

6. The method of claim 5 wherein said doping further includes depositing p-type ions.

7. The method of claim 5 wherein said forming a first and second doped regions further includes applying n+ ions.

8. The method of claim 5 wherein said doping further includes depositing n-type ions.

9. The method of claim 5 wherein said forming a first and second doped regions further includes applying p+ ions.

\* \* \* \* \*